(12) United States Patent
Zeng et al.

(10) Patent No.: US 11,555,875 B2
(45) Date of Patent: Jan. 17, 2023

(54) RF RECEIVE COIL CIRCUIT FOR MRI SYSTEMS

(71) Applicant: Coilone, LLC, Arden Hills, MN (US)

(72) Inventors: Li Zeng, Arden Hills, MN (US); David Zheng, Arden Hills, MN (US)

(73) Assignee: Coilone, LLC, Arden Hills, MN (US)

( * ) Notice: Subject to any disclaimer, the term of this patent is extended or adjusted under 35 U.S.C. 154(b) by 0 days.

(21) Appl. No.: 17/211,534

(22) Filed: Mar. 24, 2021

(65) Prior Publication Data
US 2022/0308137 A1   Sep. 29, 2022

(51) Int. Cl.
  *G01R 33/36* (2006.01)
  *H05K 1/16* (2006.01)
  *H03H 7/42* (2006.01)

(52) U.S. Cl.
  CPC ..... *G01R 33/3614* (2013.01); *G01R 33/3607* (2013.01); *H03H 7/42* (2013.01); *H05K 1/165* (2013.01)

(58) Field of Classification Search
  CPC .. G01R 33/3614; G01R 33/3607; H03H 7/42; H05K 1/165
  See application file for complete search history.

(56) References Cited

U.S. PATENT DOCUMENTS

| | | | |
|---|---|---|---|
| 5,349,298 A * | 9/1994 | Nakabayashi | G01R 33/3628 324/322 |
| 6,289,233 B1 | 9/2001 | Dumoulin et al. | |
| 7,526,330 B1 | 4/2009 | Randell et al. | |
| 8,155,419 B2 | 4/2012 | Haider et al. | |
| 8,791,696 B2 | 7/2014 | Grafendorfer et al. | |
| 2008/0297154 A1 * | 12/2008 | Otake | G01R 33/34046 324/318 |
| 2009/0076378 A1 | 3/2009 | Misic | |
| 2009/0289630 A1 | 11/2009 | Nascimento et al. | |
| 2009/0310329 A1 | 12/2009 | Brown et al. | |
| 2012/0319687 A1 | 12/2012 | Chu et al. | |
| 2013/0314091 A1 * | 11/2013 | Otake | G01R 33/3657 324/322 |
| 2014/0274395 A1 * | 9/2014 | Ellsworth | G01B 7/14 324/207.16 |
| 2017/0254864 A1 | 9/2017 | Otake et al. | |
| 2019/0154773 A1 * | 5/2019 | Stack | G01R 33/34084 |

(Continued)

FOREIGN PATENT DOCUMENTS

EP    1243938 A2    9/2002

OTHER PUBLICATIONS

Darnell et al., "WiFi-enabled RF Coil for Simultaneous MR Image Acquisition and Wireless Communication," Proc. Intl. Soc. Mag. Reson. Med. 25, 2017, 2 pages.

(Continued)

*Primary Examiner* — G. M. A Hyder
(74) *Attorney, Agent, or Firm* — Merchant & Gould P.C.

(57) ABSTRACT

An apparatus and method for receiving a magnetic resonance (MR) signal for imaging a patient. The MR signal includes a MR frequency. A radio frequency (RF) coil has first and second end portions. An impedance converter is in electrical communication with the RF coil. A preamplifier in electrical communication with the impedance converter, the preamplifier having a gain. At least one resonant circuit electrically connected to at least one end portion of the RF coil.

32 Claims, 7 Drawing Sheets

(56) References Cited

U.S. PATENT DOCUMENTS

| | | |
|---|---|---|
| 2019/0277926 A1 | 9/2019 | Stormont et al. |
| 2019/0310329 A1 | 10/2019 | Malik et al. |
| 2019/0326501 A1 | 10/2019 | Gilbert et al. |
| 2019/0339344 A1 | 11/2019 | Miosga et al. |
| 2020/0081080 A1* | 3/2020 | Zemskov ......... G01R 33/34084 |
| 2020/0271739 A1 | 8/2020 | Zhu |

OTHER PUBLICATIONS

Fujita et al., "Array Coil Types and Design Principles," Downloaded from the Internet on Mar. 25, 2021, https://afni.nimh.nih.gov/sscc/staff/rwcox/ISMRM_2006/Syllabus%202006%20-%203340/files/H_08.pdf, 9 pages.

Fujita et al., "RF Surface Receive Array Coils: The Art of an LC Circuit," Journal of Magnetic Resonance Imaging 38, 2013, pp. 12-25.

WMA1R5A 1.5T Low Noise Low Input Impedance Pre-Amplifier Datasheet, Rev D, May 2019, Downloaded from the Internet on Mar. 25, 2021, http://www.wantcominc.com/DataSheets/WMA/WMA1R5A.pdf, 4 pages.

Fujita et al. "RF Surface Receive Array Coils: The Art of an LC Circuit" Journal of Magnetic Resonance Imaging 38:12-25 (2013), 12 pages.

International Search Report and Written Opinion for PCT/US2022/021465 dated Aug. 25, 2022, 15pgs.

\* cited by examiner

RF RECEIVE COIL CIRCUIT FOR MRI SYSTEMS

TECHNICAL FIELD

In general terms, this patent document is related to MRI systems, and more particularly to RF receive coil circuits for MRI systems.

BACKGROUND

MRI systems generate images of tissue and structures in a patient's body and are a very important tool for diagnosing and treating patients. These are very complex and sensitive machines that require precision to produce quality images. As one might expect, there is a constant need to improve MRI systems so they can generate more accurate and detailed images, which can make it easier to view and understand the tissue and structures represented in the image. In turn, increased clarity and accuracy of the image can lead to more accurate diagnoses and treatments.

An MRI system has a tube assembly in which a patient lies on a table. The tube assembly includes a series of high-power magnets, gradient coils, RF transmit coils, and RF receive coils. These magnets and coils interface with and manipulate the cells within a patient's body. The vast majority of cells in the body contain hydrogen atoms, which have a nucleus that rotates around an axis. Normally, these axes are randomly orientated throughout a patient's body. But exposure to a generally uniform magnetic field from the high-power magnet causes all of the hydrogen nuclei to align so that their axes are parallel to the z-axis (i.e., the axis of the MRI machine). Hydrogen nuclei also resonate or vibrate at a relatively uniform frequency.

When one of the gradient coils is excited with an RF signal, it creates a gradient in the magnetic field along a slice that extends through the patient's body. The gradient is a change in the magnetic field generated by the high-power magnet. The gradient in the magnetic field defines the slice through the patient's body for imaging.

The angular orientation of the hydrogen nuclei within that slice of the patient's body tip is at an angular orientation different than the rest of the hydrogen nuclei in the patient's body. The hydrogen nuclei in the slice then resonate or vibrate at a frequency different from the hydrogen nuclei outside of the slice.

The RF transmit coil is then excited with a pulse having a relatively narrow bandwidth of frequencies that includes the frequency corresponding to the frequency at which the hydrogen nuclei in the slice resonate or vibrate. The resonance or vibration of the hydrogen nuclei in the slice increases and they absorb extra energy from the pulse. When the pulse ends, the hydrogen nuclei release the extra energy, which induces an electrical signal or MRI signal in the RF receive coil.

The MRI signal induced in the RF receive coil typically has multiple frequency components, including a magnetic resonance (MR) frequency. The MR frequency is the component of the signal inducted in the RF receive coil that is generated by the resonating or vibrating hydrogen nuclei in the slice, and it is the component of the signal that carries information about the patient's tissue within the slice. The MRI machine uses that electrical signal and information at the MR frequency to generate an image of the body that caregivers can use when diagnosing and treating the patient.

Frequency components in the induced signal other than the MR frequency create noise that degrades the clarity and accuracy of the resulting MRI image. Noise is the unwanted portion of the signal that can obscure the information carried in the signal. It technically is a ratio of the desired signal power to the noise power and is defined as:

$$SNR = P_{signal}/P_{noise} \qquad (1)$$

where SNR is the signal-to-noise ratio, $P_{signal}$ is the average power of the meaningful or useful portion of the signal, and $P_{noise}$ is the average power of the noise that is unwanted and obscures the useful portion of the signal.

A problem is that noise increases as MRI designers use more and more channels in an MRI system in an effort to increase image clarity and detail. Each channel uses a separate RF receive coil. For example, an MRI system might use as many as 64 or more RF receive coils. These coils are commonly overlapped to fit them in the MRI system. Overlapping coils increase mutual inductance between coils. Mutual inductance will cause the signal in one RF receive coil to affect the amplitude of the signal in another mutually coupled coil. Accordingly, the signal on one RF receive coil can distort the signal induced on other RF receive coils, which in turn increases noise.

In an effort to minimize noise and coupling between RF receive coils, the output of each RF receive coil typically is fed through a Balun and a low impedance preamplifier. This structure increases the blocking impedance due to the preamplifier, which in turn increases isolation of the RF receive coils from one another and the SNR for the signal output by the preamplifier. The low input impedance of the preamplifier can help isolate the RF coil, but as discussed herein it also can cause dog-ear peaks in the preamplifier gain at frequencies other than the MR frequency. These peaks can cause the preamplifier to oscillate and become unstable.

FIGS. 1 and 2 illustrate the source impedance and gain profiles for a typical low-impedance preamplifier used in current MRI systems to process the MRI signal output by the RF receive coil. FIG. 1 plots the gain and source impedance against the frequency for the MRI signal. In this example, the preamplifier is operating in an environment of 21° C. and has a gain of 28 dB at its defined operating bandwidth, which includes the MR frequency of 63.8 MHz. The designed source impedance for the preamplifier is approximately 125 Ohms. Other typical low-impedance preamplifiers and related circuits will have different gains and different operating frequencies. Additionally, they can be used in circuits with different designed source impedances such as 50 Ohms, 100 Ohms, 150 Ohms, 200 Ohms, or 300 Ohms. But these alternative low-impedance preamplifiers will have similar performance profiles as illustrated in FIGS. 1 and 2.

A first trace 100 plots the source impedance against the frequency of the input signal. The source impedance peaks at the MR frequency, which is 63.8 MHz in the illustrated example, and then falls from the peak as the frequency increases or decreases. A second trace 104 plots the preamplifier gain against the signal frequency. The second trace 104 shows that the preamplifier gain has a camel-hump or dog-ear profile with first and second dog-ear peaks 102 and 106 at first and second dog-ear frequencies 108 and 110, respectively. The first and second dog-ear frequencies 108 and 110 are frequencies at which the preamplifier is unstable or even oscillates. The first dog-ear frequency 108 is lower than the MR frequency of 63.8 MHz, and the second dog-ear frequency 110 is higher than the MR frequency of 63.8 MHz. The preamplifier gain at the first and second dog-ear frequencies 108 and 110 is higher than the gain at the MR frequency, and the gain at the dog-ear frequencies 108 and 110 can be as much as 10 dB or more than the gain at the MR frequency.

A cause of the dog-ear profile for the preamplifier gain can be seen in FIG. 2. Trace 112 plots the gain of the preamplifier against its source impedance. In the illustrated example, the preamplifier has an operating gain of 28 dB at a designed source impedance of 125 Ohms. As shown in the plot, the preamplifier gain increases as the source impedance falls from the designed source impedance and reaches maximum gain when the source impedance has a conjugate match to the input impedance of the preamplifier. This input impedance is lower than the designed source impedance at the operating frequencies that corresponds to the MR frequency. Additionally, the frequency of the signal being processed affects the source impedance seen by the preamplifier. The source impedance seen by the preamplifier falls as the signal frequency shifts from the MR frequency. The falling source impedance causes the preamplifier gain to increase resulting in the first and second dog-ear peaks 102 and 106.

Another problem is that the MRI data used to create the image slice is carried at the MR frequency. High gain and oscillation at frequencies on either side of the MR frequencies makes it difficult to extract the MRI data from the signal and results in a poor quality image or even no image at all. Developers of MRI systems have tried to address this problem using different signal processing techniques such as introducing a small insertion loss, which results in lowering the power of the signal input to the preamplifier. This technique lowers the signal-to-noise ratio, which increases the relative amount of noise in the MRI signal. Another technique that has been tried is passing the signal output by the preamplifier through a very narrow bandpass filter to suppress the gain corresponding to the dog-ear peaks 102 and 106. However, a bandpass filter also results in insertion loss. Yet another technique that has been tried is using negative feedback to reduce the gain at the dog-ear frequencies 108 and 110, but this technique also has not effectively reduced the effects of the dog-ear peaks 102 and 106 in MRI systems.

DETAILED DESCRIPTION

Various embodiments will be described in detail with reference to the drawings. Reference to the drawings and various embodiments in this written specification does not limit the scope of the claims attached hereto. Additionally, any examples set forth in this written specification are not intended to be limiting and merely set forth some of the many possible embodiments for the appended claims.

For purposes of this patent document, the terms "or" and "and" shall mean "and/or" unless stated otherwise or clearly intended otherwise by the context of their use. Whenever appropriate, terms used in the singular also will include the plural and vice versa. Use of the term "a" means "one or more" unless stated otherwise or where the use of "one or more" is clearly inappropriate. Use of the term "or" means "and/or" unless stated otherwise. Use of the terms "comprise," "comprises," "comprising," "include," "includes," "including," "having," and "has" are interchangeable and are not intended to be limiting. For example, the term "including" shall mean "including, but not limited to." The term "such as" also is not intended to be limiting.

All ranges provided herein include the upper and lower values of the range unless explicitly noted. Although values are disclosed herein when disclosing certain exemplary embodiments, other embodiments within the scope of the pending claims can have values other than the specific values disclosed herein or values that are outside the ranges disclosed herein.

Terms such as "approximately," "substantially," or "about" when used with values or structural elements provide a tolerance that is ordinarily found during testing and production due to variations and inexact tolerances in factors such as materials, equipment, and manufacturing processes and equipment. These terms also provide a tolerance for variations due to environmental conditions such as temperature and humidity. Such variations also can be due to normal wear and tear over the life of apparatuses that embody the appended claims. Additionally all values disclosed herein are approximate values regardless of whether they are explicitly noted as being approximate.

In general terms, one aspect of this patent document relates to apparatuses and methods for increasing the source impedance at select frequencies for a preamplifier in an RF receive coil circuit. Another aspect relates to increasing the source impedance at select frequencies while substantially maintaining the source impedance at the preamplifier's operating frequency that corresponds to the MR frequency. It also relates to increasing the blocking impedance at select frequencies for an RF receive coil in an RF receive coil circuit. It also relates to decreasing the gain of a preamplifier at select frequencies. Another aspect is decreasing the gain of a preamplifier at select frequencies while substantially maintaining the gain at the preamplifier's operating frequency that corresponds to the MR frequency.

Figure 3:
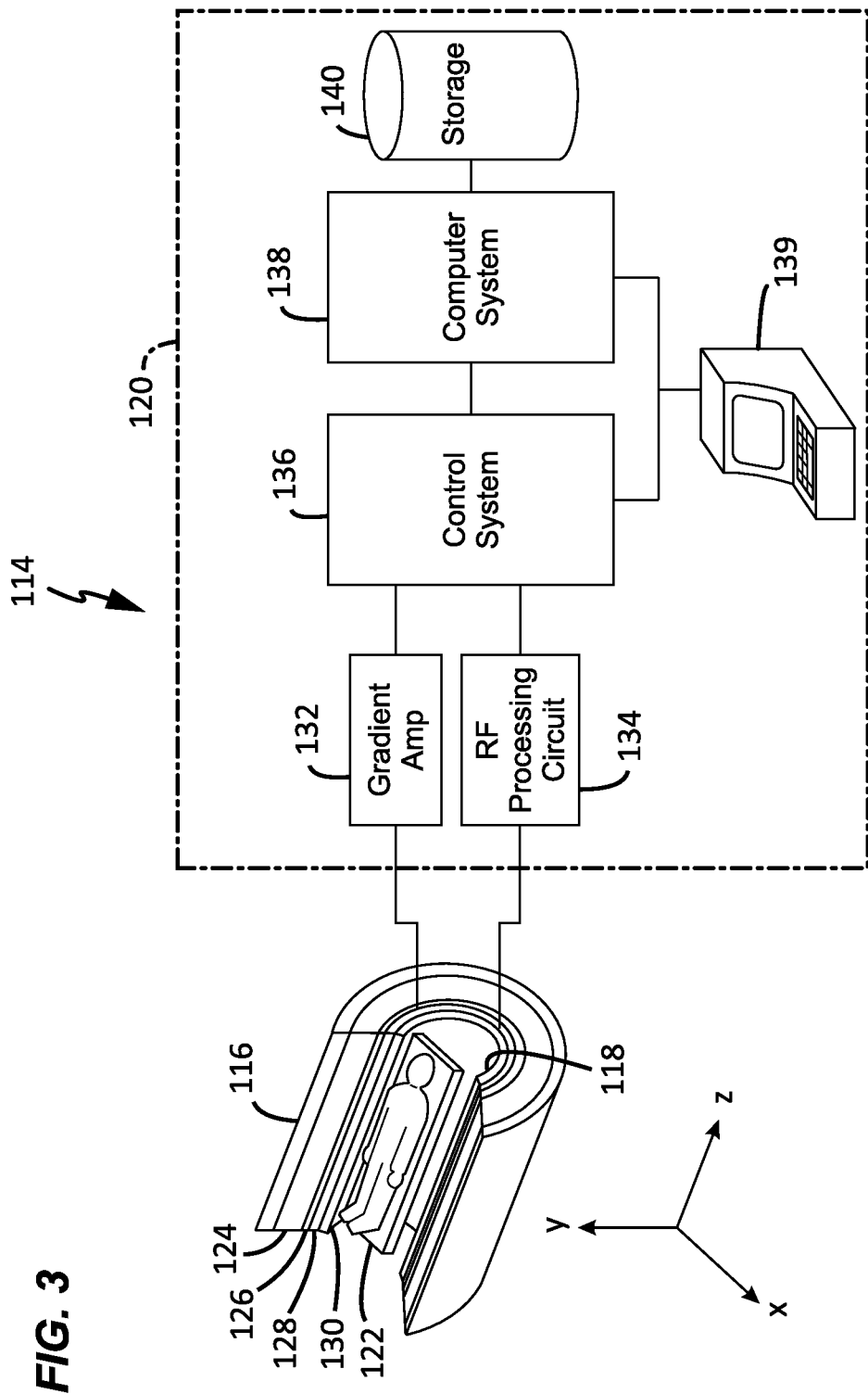
FIG. 3 illustrates an MRI system.

Referring now to FIG. 3, a magnetic resonance imaging (MRI) system 114 generally includes a tube assembly 116 that defines a bore 118 and a coordinate system having x-, y-, and z-axes. A patient table 122 is positioned in the bore 118. The z-axis is horizontal and runs longitudinally generally parallel to the length of the bore 118 and the patient table 122, the y-axis runs vertically, and the x-axis runs horizontally from side-to-side.

The tube assembly 116 has a high-power magnet 124, gradient coil 126, RF transmit coil 128, and RF receive coil 130. The high-power magnet 124 generates a very strong and uniform magnetic field. The high-power magnet 124 can be formed with any suitable magnets such as permanent magnets; electromagnets (sometimes called resistive magnets); superconducting magnets, which are electrical coils formed from superconductors; or combinations of different types of magnets. The high-power magnet 124 can be a single magnet or formed with multiple magnets that cooperate to generate a high strength magnetic field. In various embodiments, the high-power magnet 124 generates a strong magnetic field such as fields of approximately 0.1 Tesla, 0.5 Tesla, 1 Tesla, 1.5 Tesla, 3 Tesla, 4.7 Tesla, 7 Tesla, 8 Tesla, 9.4 Tesla, 10.5 Tesla, 11.4 Tesla, 11.7 Tesla, 14 Tesla, or higher.

The gradient coil 126 typically includes at least three coils. There is typically at least one gradient coil 126 parallel to each of the x-, y-, and z-axes. Typically, the gradient coils 126 are generally orthogonal to each other. Alternative embodiments can have different numbers and arrangements of gradient coils 126. For example, there can be multiple gradient coils 126 parallel to a given axis of the tube assembly 116. Embodiments also can have gradient coils 126 that are positioned at an oblique angle relative to one or more of the axes or relative to other gradient coils 126.

In example embodiments, the RF transmit coil 128 extends along the z-axis for a length sufficient to extend the entire length of a patient's body. In other embodiments, the RF transmit coil assembly 128 is shorter. For example, the RF transmit coil assembly 128 can have a length sufficient to extend along the length of a typical patient's head, torso, limb, or any other portion of the anatomy to be imaged. In at least some example embodiments, the RF transmit coil 128 can extend around the entire circumference of the patient's body or around only a portion of the patient's body. In example embodiments of the MRI system 114, the RF transmit coil 128 can be a single RF transmit coil or multiple RF transmit coils.

In various embodiments of the MRI system 114, the RF receive coil 130 can be a single RF receive coil or multiple RF receive coils. RF receive coils 130 are described in more detail herein. In at least some example embodiments, multiple RF receive coils 130 are arranged in a coil array and the individual coils 130 within the array may overlap each other. Alternatively, in at least some embodiments, the RF receive coils 130 in a coil array do not overlap and may be parallel to each other. The RF receive coil 130 can be integrated into the structure of the tube assembly 116, or the RF receive coil 130 can be free to position in different locations such as a position in close proximity to the particular anatomy of interest. Other arrangements of the RF receive coils 130 are possible. When the MRI system 114 has multiple RF receive coils 130, it can have any suitable number of coils such as 8 coils, 16 coils, 32 coils, 64 coils, 128 coils, or 256 coils.

In at least some embodiments, the same RF coils can be used as both the RF transmit coils and the RF receive coils.

In addition to the tube assembly 116, the MRI system 114 typically includes gradient amplifiers 132, an RF processing circuit 134, a system controller 136, a computer system 138, memory 140, and a computer terminal 139. The gradient amplifiers 132 include an amplifier for each set of gradient coils 126 having a particular orientation. For example, there is an amplifier for the gradient coils 126 corresponding to the x-axis, an amplifier for the gradient coils 126 corresponding to the y-axis, and an amplifier for the gradient coils 126 corresponding to the z-axis. Each amplifier excites its corresponding gradient coils 126 to create gradients in the magnetic field. As discussed herein, the gradient defines the location of a slice through the patient's body for imaging.

The RF processing circuit 134 includes components for exciting the RF transmit coils 128 and for processing signals received from the RF receive coils 130. For example, at least some embodiments of an RF processing circuit 134 include a signal generator, waveform generator, or pulse generator to generate signals for exciting the RF transmit coils 128. Amplifiers amplify these signals as they are input to the RF transmit coils 128. The RF processing circuit 134 also includes amplifiers, signal filters such as bandpass filters, and analog-to-digital circuits (ADC) that process MRI signals received from the RF receive coils 130. The RF processing circuit 134 digitizes the MRI signal and then communicates the digitized MRI signal to the system controller 136.

The system controller 136 interfaces with the gradient amplifiers 132, the RF processing circuit 134, and the computer system 138. The system controller 136 receives digitized MRI signals from the RF processing circuit 134 and extracts MRI image data from those digitized signals. The system controller 136 communicates the MRI image data to the computer system 138 for storage in memory 140 and for further processing. When enough MRI image data is collected, the computer system 138 will generate an MRI image for display on the computer terminal 139. The system controller 136 also interfaces with a patient positioning system that controls the position of the patient table 122.

The computer terminal 139 interfaces with the system controller 136 and the computer system 138 and provides an interface through which an operator can enter commands and control the MRI system 114 to scan a patient's body and display MRI images. The computer terminal 139 also can be used to view the MRI images.

The MRI system 114 illustrated in FIG. 3 and disclosed herein is one of many possible embodiments. Other embodiments of the MRI system 114 can have hardware and software components, system architecture, and functionality other than those described herein.

Figure 4:
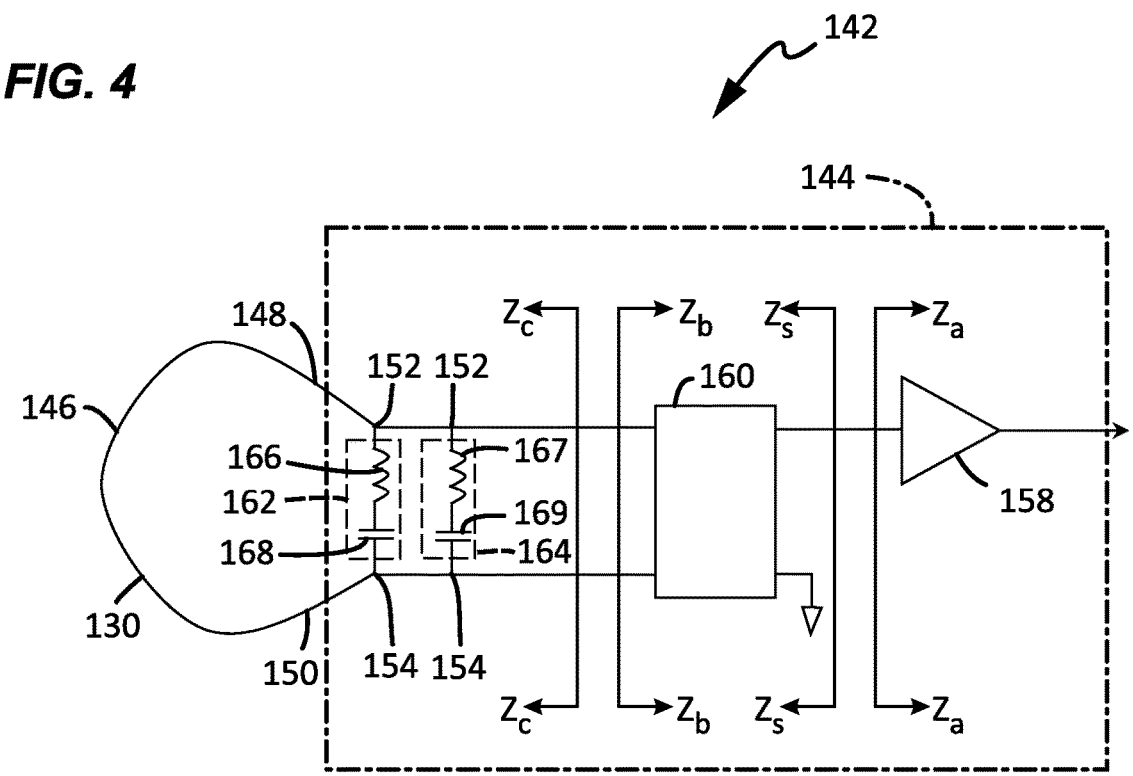
FIG. 4 is a circuit diagram illustrating an RF receive coil circuit from the MRI system illustrated in FIG. 3.

Referring now to FIG. 4, in at least some embodiments, the RF receive coil 130 and feed circuit 144 form an RF receive coil circuit 142. Although the term "RF receive coil" is used, one skilled in the art will understand that the same coil, in at least some example embodiments, can be used as both an RF receive coil and an RF transmit coil.

In at least some embodiments, the RF receive coil 130 is a single conductive loop having first and second end portions 148 and 150 that end at first and second terminals 152 and 154, respectively. In alternative embodiments, the RF receive coil 130 can have multiple conductive loops. The RF receive coil 130 can have any suitable shape such as rectangular, circular, oblong, or any other suitable shape. The shape and dimensions of the RF receive coil 130 can depend on a variety of factors such as the magnetic field strength of the MRI system 114, the portion of a patient's body to be imaged (e.g., torso, limb, head, etc.), the type of tissue or organs to be imaged, or packaging requirements for fitting RF receive coils 130 into the tube assembly 116. Additionally, the RF receive coil 130 can be formed from any suitable form of transmission line such as a strip line, wire, or cable.

The RF receive coil 130 can have any suitable configuration. For example, the RF receive coil 130 can be a volume coil, circularly polarized coil, quadrature coil, birdcage coil, single turn solenoid coil, or surface coil. It also can be adapted to be positioned outside the patient's body or in the patient's body such as in a cavity or vessel.

In at least some embodiments, the feed circuit 144 includes a preamplifier 158, a coupling circuit 160, and first and second resonant circuits 162 and 164. The preamplifier 158 is a low noise amplifier having a low input impedance, $Z_a$, and a low noise figure.

In at least some example embodiments, for an MRI system 114 having a magnetic field of approximately 1.5

Tesla, the preamplifier 158 has a bandwidth of operating frequencies, which include an MR frequency of 63.8 MHz, an overall bandwidth in the range of approximately 17 MHz to approximately 500 MHz, an input impedance, $Z_a$, of approximately 1.5 Ohms, a gain of approximately 28 dB, and a noise figure of approximately 0.5 dB or less. In at least some other example embodiments, the preamplifier 158 has an input impedance, $Z_a$, in the range of approximately 50 Ohms or less, a gain in the range of approximately 25 dB to approximately 35 dB, and a noise figure in the range of approximately 0.0 dB to approximately 1.0 dB. Other example embodiments have an operating frequency, input impedance, $Z_a$, gain, or noise figure either higher or lower than these ranges. An example of a preamplifier 158 suitable for use on RF receive coils 130 in an MRI system 114 is amplifier model WMA1R5A from WanTcom Inc. having its principle place of business in Chanhassen, Minn.

In at least some example embodiments, the first and second resonant circuits 162 and 164 are electrically connected between the first and second terminals 152 and 154 of the RF receive coil 130. Each of the first and second resonant circuits 162 and 164 has an inductor 166 and 167, respectively, arranged in series with a capacitor 168 and 169, respectively. The inductors 166 and 167 and capacitors 168 and 169 can be arranged in any order. For example, in some embodiments, the inductor 166 in the first resonant circuit 162 is connected to the first terminal 152 and the capacitor 168 is connected between the inductor 166 and the second terminal 154. Similarly, the inductor 167 in the second resonant circuit 164 is connected to the first terminal 152 and the capacitor 169 is connected between the inductor 167 and the second terminal 154. In other example embodiments, the positions of the inductors 166 and 167 and capacitors 168 and 169, respectively, can be reversed.

In at least some alternative embodiments, the first and second resonant circuits 162 and 164 have a configuration other than a series resonant circuit as illustrated in FIG. 4 and disclosed herein. In some embodiments, for example, the first and second resonant circuits 162 and 164 can be parallel resonant circuits.

In at least some example embodiments, the capacitors 168 and 169, the inductors 166 and 167, or both the capacitors 168 and 169 and the inductors 166 and 167 are adjustable so that the resonant circuits 162 and 164 can be tuned to resonate at determined resonant frequencies.

Figure 1:
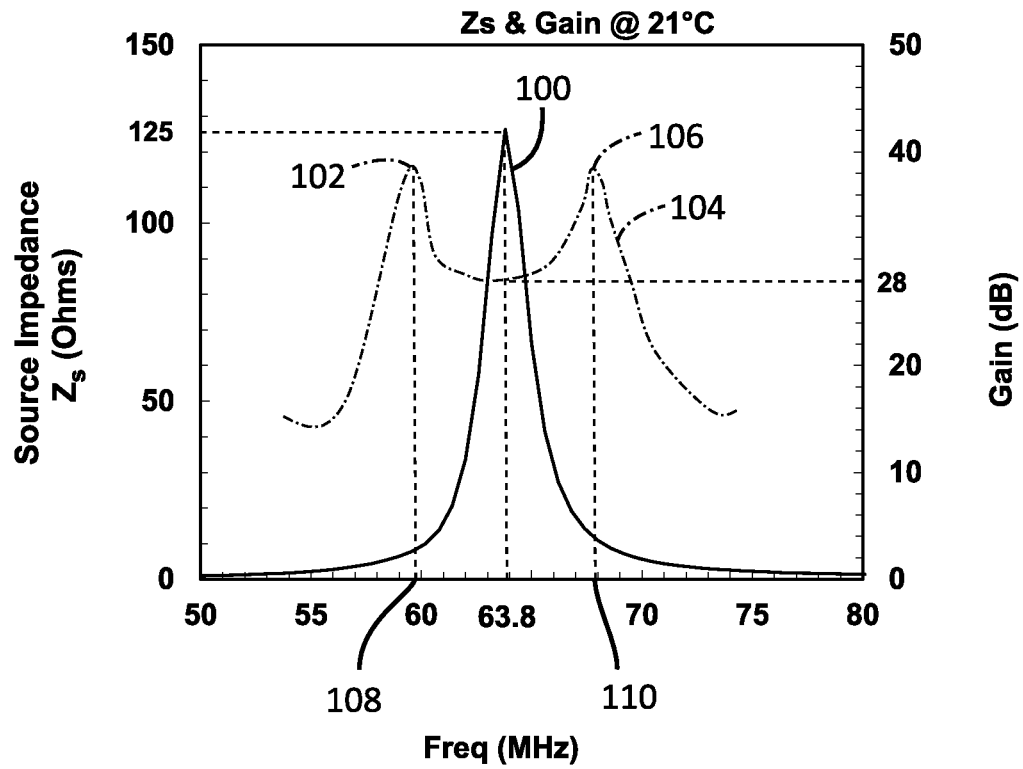
FIG. 1 plots the source impedance and preamplifier gain against frequency, the preamplifier gain having two dog-ear peaks at select frequencies.
Figure 2:
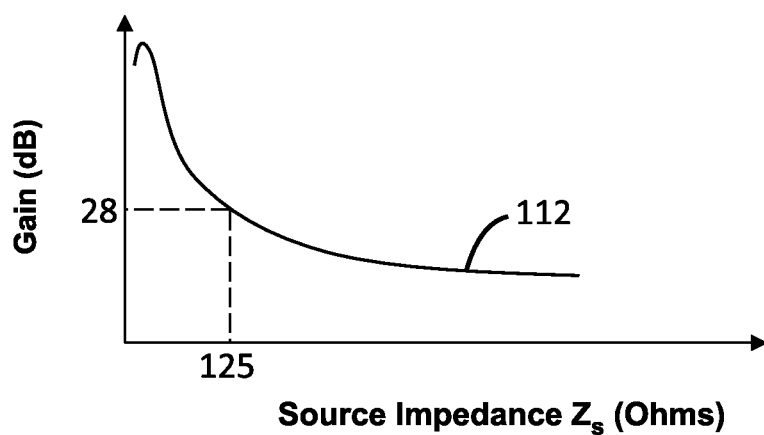
FIG. 2 plots the source impedance against the gain of a preamplifier.

In at least some example embodiments, the first resonant circuit 162 is tuned to resonate at a frequency approximately equal to the first dog-ear frequency 108 corresponding to the first dog-ear peak 102 (see, e.g., FIG. 1), and the second resonant circuit 164 is tuned to be approximately equal to the second dog-ear frequency 110 corresponding to the second dog-ear peak 106 (see, e.g., FIG. 1). In example embodiments, the first resonant circuit 162 is tuned to a frequency in the range of approximately 58 MHz to approximately 61 MHz, and the second resonant circuit 164 is tuned to a frequency in the range of approximately 68 MHz to approximately 70 MHz for coils in a 1.5 Tesla MRI System.

The first and second dog-ear frequencies 108 and 110 can vary depending on different factors such as the impedance values of the RF receive coil circuit 142, the preamplifier 158, the impedance converter 160, the coil 130, the strength of the magnetic field generated by the high-power magnet 124, variations and tolerance in the operating values for the electrical components, variations and tolerance in the manufacturing process, and environmental factors. An advantage of tuning the resonant frequency is that it can be approximately, or even exactly, matched to the particular dog-ear frequencies for the RF receive coil circuit 142.

In at least some example embodiments of a 1.5 Tesla MRI system, the inductor 166 in the first resonant circuit 162 has a value in the range of approximately 1.5 µH to approximately 3 µH, and the capacitor 168 has a value in the range of approximately 0.5 pF to approximately 3 pF. The inductor 167 in the second resonant circuit 164 has a value in the range of approximately 1.5 µH to approximately 3 µH, and the capacitor 169 has a value in the range of approximately 0.5 pF to approximately 3 pF. An example of inductors that can be used in the first and second resonant circuits 162 and 164 is model 1008CS-222XGLC available from Coilcraft, Inc. having its principle place of business in Cary, Ill. An example of capacitors that can be used in the first and second resonant circuits 162 and 164 is model JR030 available from Voltronics, Inc. having its principle place of business in Chicago, Ill.

The coupling circuit 160 provides an electrical coupling between the RF receive coil 130 and the preamplifier 158. In an example embodiment, the coupling circuit 160 converts a balanced signal from the RF receive coil 130 to an unbalanced signal for amplification by the preamplifier 158.

Figure 5:
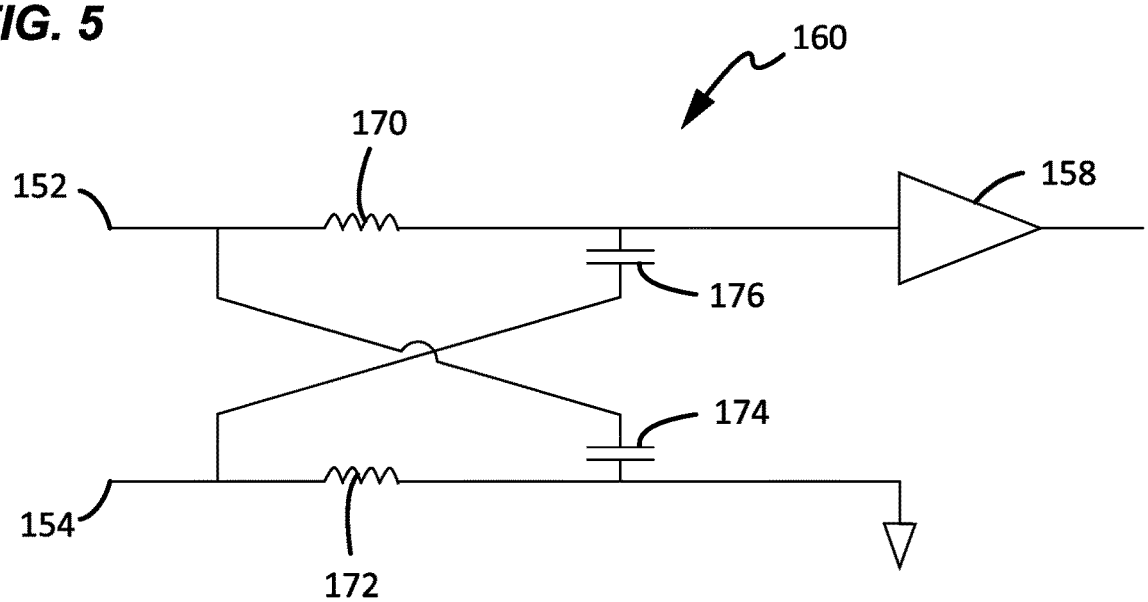
FIG. 5 illustrates a coupling circuit included in the RF receive coil circuit illustrated in FIG. 4.

An example of a coupling circuit 160 is a 90° lattice-type Balun as illustrated in FIG. 5. The lattice-type Balun is an LC network having a first inductor 170 in electrical communication from the first terminal 152 of the RF receive coil 130 to the preamplifier 158 and a second inductor 172 in electrical communication from the second terminal 154 of the RF receive coil 130 to ground. A first capacitor 174 is in electrical communication from the first terminal 152 of the RF receive coil 130 to ground, and a second capacitor 176 is in electrical communication from the second terminal 154 of the RF receive coil 130 to the input of the preamplifier 158.

In other example embodiments, the coupling circuit 160 uses a Balun other than a lattice-type Balun. Yet other example embodiments use a coupling circuit 160 other than a Balun or has a direct electrical connection from the RF receive coil 130 to the preamplifier 158.

An advantage of the coupling circuit 160 is that it can provide a high blocking impedance, $Z_b$, which helps isolate the RF receive coil 130 from other RF receive coils when the MRI system 114 uses multiple RF receive coils 130. This isolation reduces noise that can result from mutual inductance between the RF receive coils 130 and that can otherwise find its way into the MRI signal. The high blocking impedance, $Z_b$, can be produced at least in part by providing a high source impedance, $Z_s$, and a low input impedance, $Z_a$. The relationships of these impedance values can be defined as $$Z_b \times Z_a = Z_s \times Z_c, \qquad\qquad \text{or (2)}$$

$$Z_b = (Z_s \times Z_c)/Z_a \qquad\qquad (3)$$

where $Z_c$ is the impedance of the transmission line forming the RF receive coil 130. In at least some example embodiments, the input impedance, $Z_a$, is at least partially defined by the preamplifier 158, and the source impedance, $Z_s$, is at least partially defined by the circuitry disclosed herein.

In an example embodiment, impedance values for an MRI system having a 1.5 Tesla magnetic field are 2.5 Ohms for $Z_c$, 1.5 Ohms for $Z_a$, and 150 Ohms for $Z_s$. These values provide a blocking impedance, $Z_b$, of 250 Ohms. In other example embodiments, the blocking impedance, $Z_b$, is in the range of approximately 100 Ohms to approximately 5000 Ohms.

Figure 6:
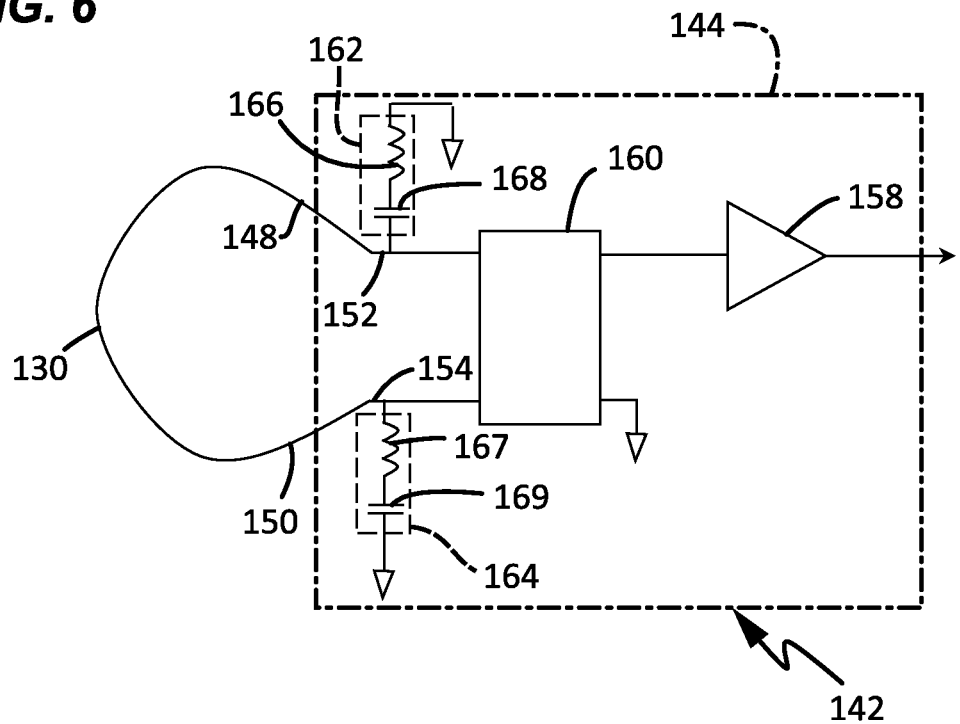
FIG. 6 is an alternative embodiment of the RF receive coil circuit illustrated in FIG. 4.

FIG. 6 illustrates an alternative embodiment of the RF receive coil circuit 142. This example embodiment is substantially similar to the embodiment illustrated in FIG. 4 and includes an RF receive coil 130, first and second resonant circuits 162 and 164, a coupling circuit 160, and a preamplifier 158. However, the first resonant circuit 162 is electrically connected between the first terminal 152 of the RF receive coil 130 and ground, and the second resonant circuit 164 is electrically connected between the second terminal 154 of the RF receive coil 130 and ground.

Figure 7:
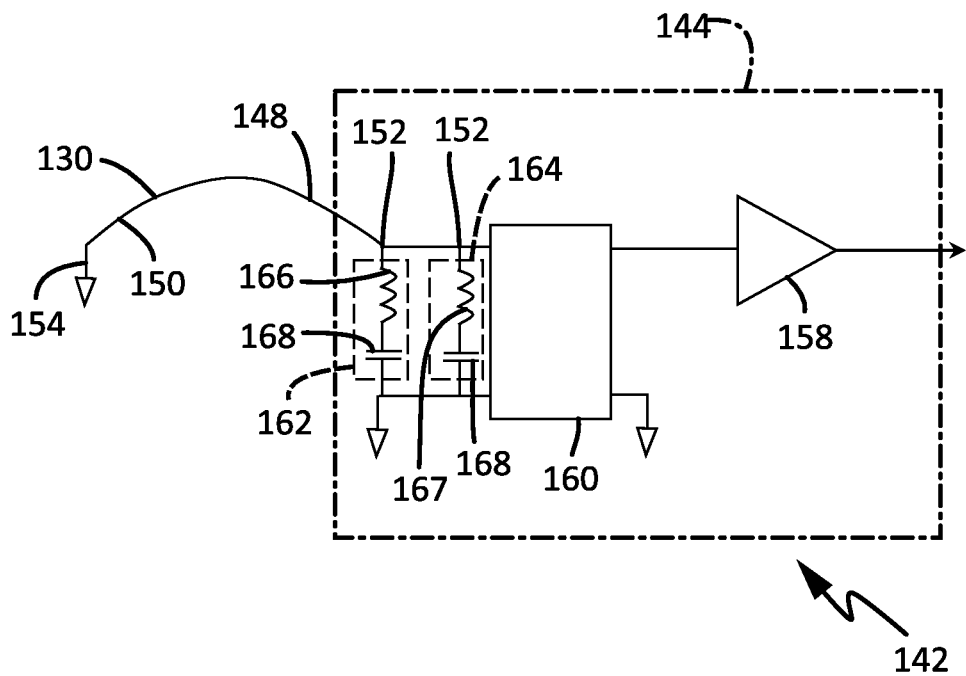
FIG. 7 is another alternative embodiment of the RF receive coil circuit illustrated in FIG. 4.

FIG. 7 illustrates an alternative embodiment of the RF receive coil circuit 142. This example embodiment is substantially similar to the embodiment illustrated in FIG. 4 and includes an RF receive coil 130, first and second resonant circuits 162 and 164, a coupling circuit 160, and a preamplifier 158. However, the second terminal 154 of the RF receive coil 130 is connected to ground instead of the coupling circuit 160. Additionally, both of the first and second resonant circuits 162 and 164 are connected between the first terminal 152 of the RF receive coil 130 and ground.

Figure 8:
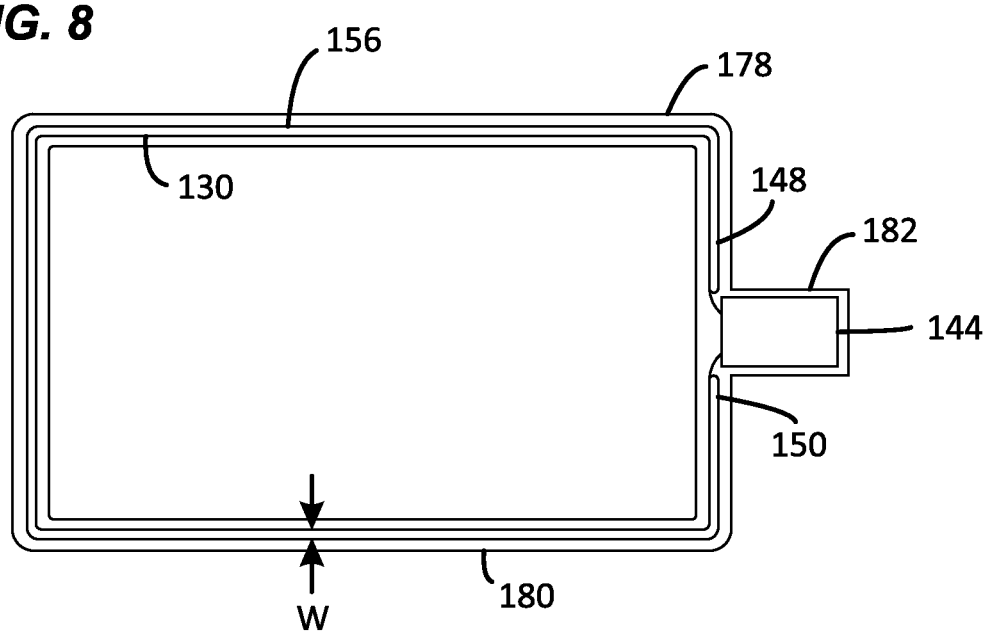
FIG. 8 is a top plane view of a circuit board carrying the RF receive coil circuit shown in FIG. 4.

Referring now to FIG. 8, the RF receive coil 130 and feed circuit 144 are mounted on a circuit board 178 having a coil portion 180 formed in a loop having the same approximate shape and dimensions as the RF receive coil 130 and a feed board portion 182. The RF receive coil 130 is mounted on the coil portion 180, and the feed circuit 144 is mounted on the feed board portion 182. In at least some example embodiments, the RF receive coil 130 is formed from a strip line 156. The width and length of the strip line 156 can vary on a variety of factors such as the strength of the magnetic field generated by the MRI system 114. In alternative embodiments, the coil portion 180 and the feed board portion 182 are separate circuit boards having a transmission line or other electrical path between them.

In example embodiments, the circuit board 178 is a printed circuit board (PCB) formed with a dielectric material. The circuit board 178 can have a single layer or multiple layers of material. One surface of the circuit board 178 has transmission lines to form the RF receive coil 130 and conductive paths to electrically connect various electrical components. Another surface of the feed board portion 182, typically the bottom surface, has a ground plane, which is a coating of electrically conductive material. The coil portion 180 of the circuit board 178 typically does not include a ground plane. The transmission lines, electrical conductors, and ground plane can be formed with copper or any other suitable electrically conductive material and can be laminated. The transmission lines can be on the surface of the circuit board 178 or they can be positioned between layers of the circuit board 178. Electrical components that form the feed circuit 144 can be mounted on the surface of the circuit board 178 or mounted between layers of the circuit board 178. In various embodiments, the circuit board 178 can be a rigid circuit board or a flexible circuit board.

In at least some alternative embodiments, the circuit board 178 does not have a coil portion 180. For example, in embodiments, when the RF receive coil 130 is formed from a wire or cable, the circuit board 178 will not have a coil portion 180, and the coil will be electrically connected to the feed circuit 144 through terminals, connectors, solders, or some other connecting structure.

Figure 9:
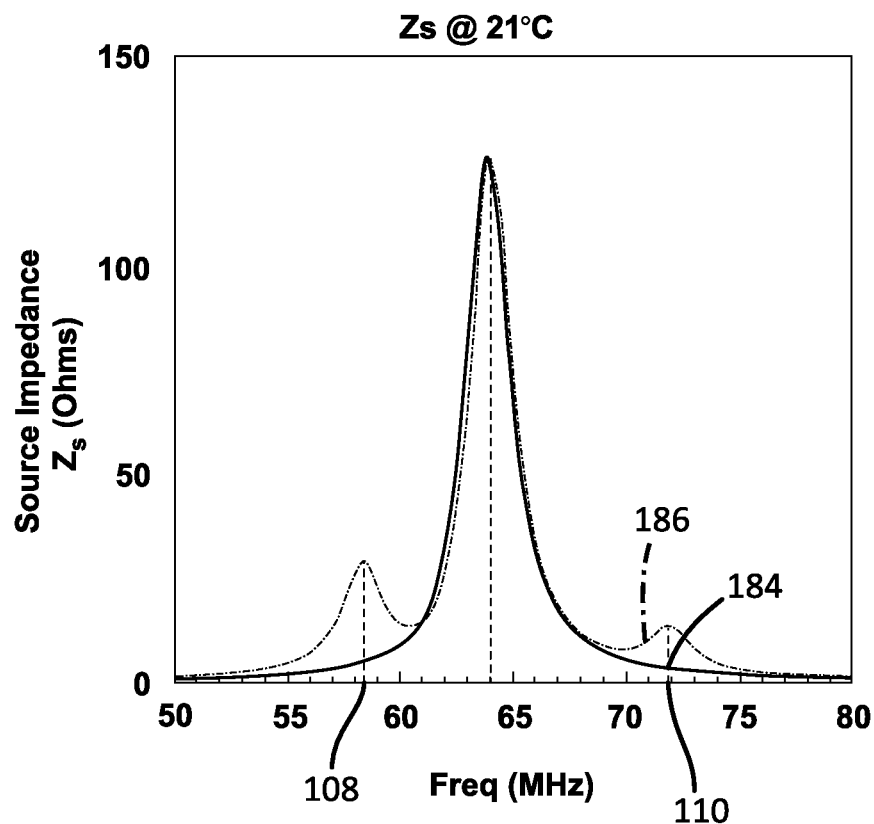
FIG. 9 is a plot modeling the source impedance of the RF receive coil circuit illustrated in FIG. 4.

FIG. 9 models the source impedance, $Z_s$, for the RF receive coil circuit 142 shown in FIG. 4 operating in an environment of 21° C. both with and without the first and second resonant circuits 162 and 164. In this model, the preamplifier 158 has a bandwidth of operating frequencies that includes a MR frequency of 63.8 MHz, a gain of 28 dB, and an input impedance, $Z_a$, of 1.5 Ohms. The coupling circuit 160 is a 90° lattice-type Balun formed with inductors 170 and 172 with an inductance of approximately 90 nH and capacitors 174 and 176 with a capacitance of approximately 68 pF. The first and second resonant circuits 162 and 164 are formed with inductors 166 having an inductance of approximately 90 nH and capacitors 168 having a capacitance of approximately 68 pF.

First trace 184 plots the source impedance, $Z_s$, when the RF receive coil circuit 142 does not include the first and second resonant circuits 162 and 164. This plot is substantially similar to the performance of prior art systems as illustrated by the first trace 100 in FIG. 1. The source impedance, $Z_s$, at the first and second dog-ear frequencies 108 and 110 is low. Second trace 186 plots the source impedance, $Z_s$, when the RF receive coil circuit 142 includes the first and second resonant circuits 162 and 164. The second trace 186 shows how the first and second resonant circuits 162 and 164 increase the source impedance, $Z_s$, at the first and second dog-ear frequencies 108 and 110.

This model also shows that the source impedance, $Z_s$, at the operating frequency corresponding to the MR frequency (e.g., 63.8 MHz) of the preamplifier 158 remains substantially unchanged with the first and second resonant circuits 162 and 164 added to the RF receive coil circuit 142. It also shows that the operating frequency corresponding to the MR frequency for the preamplifier 158 remains substantially unchanged when the RF receive coil circuit 142 includes the first and second resonant circuits 162 and 164. The increased source impedance, $Z_s$, at the dog-ear frequencies 108 and 110 will in turn decrease the gain of the preamplifier 158 at the dog-ear frequencies 108 and 110 thus reducing possible oscillation of the preamplifier 158 and increasing stability of the feed circuit 144.

In example embodiments, when the first and second resonant circuits 162 and 164 are used in the RF receive coil circuit 142, the gain at the peak of the first and second dog ears 102 and 106 is not more than approximately 8 dB greater than the gain at the MR frequency. In other example embodiments, the gain at the peak of the first and second dog ears 102 and 106 is not more than approximately 12 dB, approximately 10 dB, approximately 8 dB, approximately 6 dB, approximately 4 dB, or approximately 2 dB, greater than the gain at the MR frequency. In other example embodiments, the gain at the peak of the first and second dog ears 102 and 106 is approximately equal to or less than the gain at the MR frequency. In other example embodiments, the gain at the peak of the first and second dog ears 102 and 106 is approximately 2 dB, approximately 4 dB, approximately 6 dB, approximately 8 dB, approximately 10 dB, approximately 12 dB, approximately 14 dB, approximately 16 dB, approximately 18 dB, or approximately 20 dB less than the gain at the MR frequency.

In other example embodiments, the gain at the peak of the first and second dog ears 102 and 106 when the RF receive coil circuit 142 has the first and second resonant circuits 162 and 164 is approximately 8 dB, approximately 10 dB, approximately 12 dB, approximately 14 dB, approximately 16 dB, or approximately 20 dB less than the gain at the peak of the first and second dog ears 102 and 106 when the RF receive coil circuit 142 does not have the first and second resonant circuits 162 and 164.

The reduction in gain at the first and second dog-ear frequencies 108 and 110 due to the first and second resonant circuits 162 and 164 will depend on a variety of factors. Examples of factors that can affect the reduction of gain includes the size of the MRI system 114 (e.g., the strength of the magnetic field), the tolerances of electrical components used in the RF feed coil circuit 144, how closely the first and second resonant circuits 162 and 164 are tuned to the first and second dog-ear frequencies 108 and 110 corresponding to the peaks of the first and second dog ears 102 and 106, environmental factors, physical and electrical characteristics of the RF receive coil 130, quality of electrical connections in the circuit, the various impedance values of the RF feed coil circuit 144, performance and characteristics of the preamplifier 158, and other physical and electrical characteristics of the RF feed coil circuit 144. Similar factors will also affect the level of gain at the first and second frequencies relative to the MR frequency.

Figure 10:
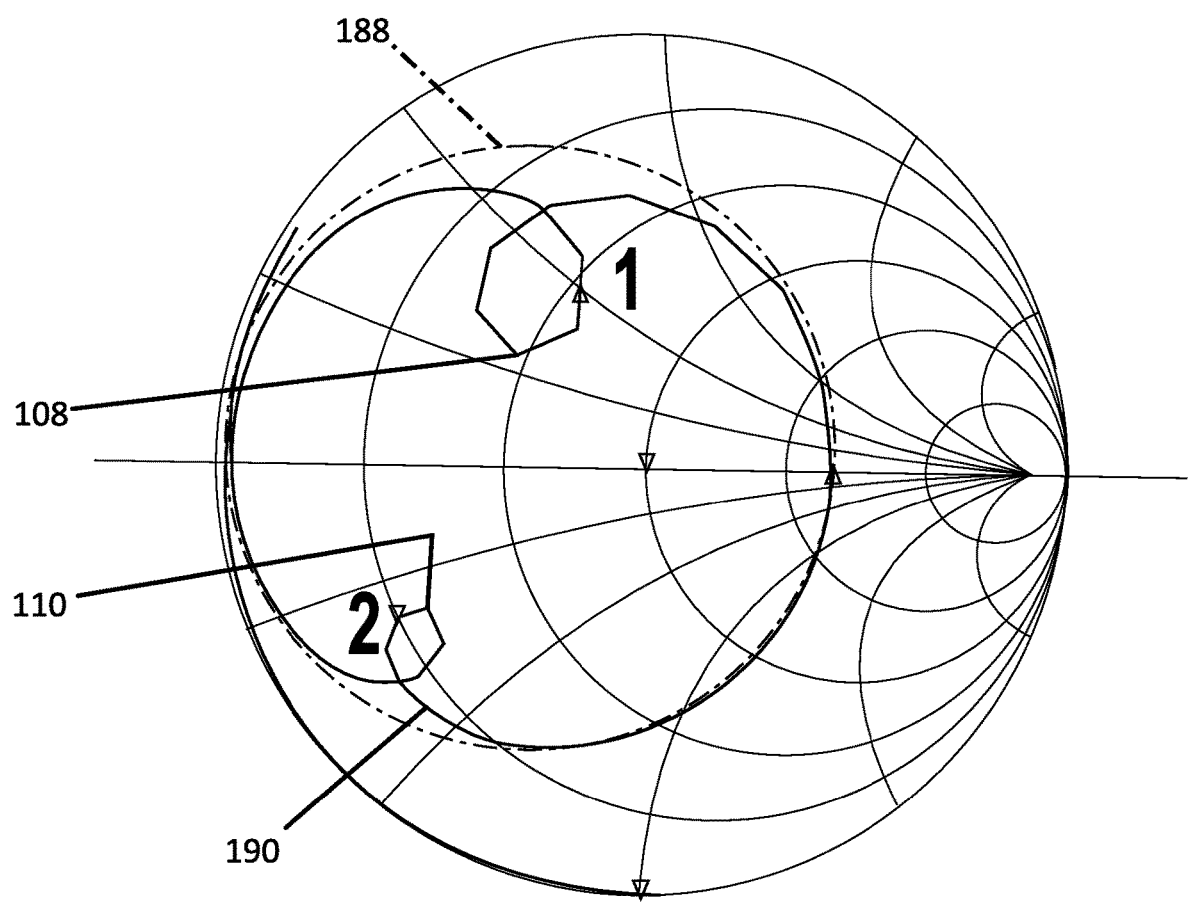
FIGS. 10-12 are plots from a working example comparing performance of the RF receive coil circuit illustrated in FIG. 4 with resonant circuits to performance of the RF receive coil circuit illustrated in FIG. 4 without resonant circuits.
Figure 11:
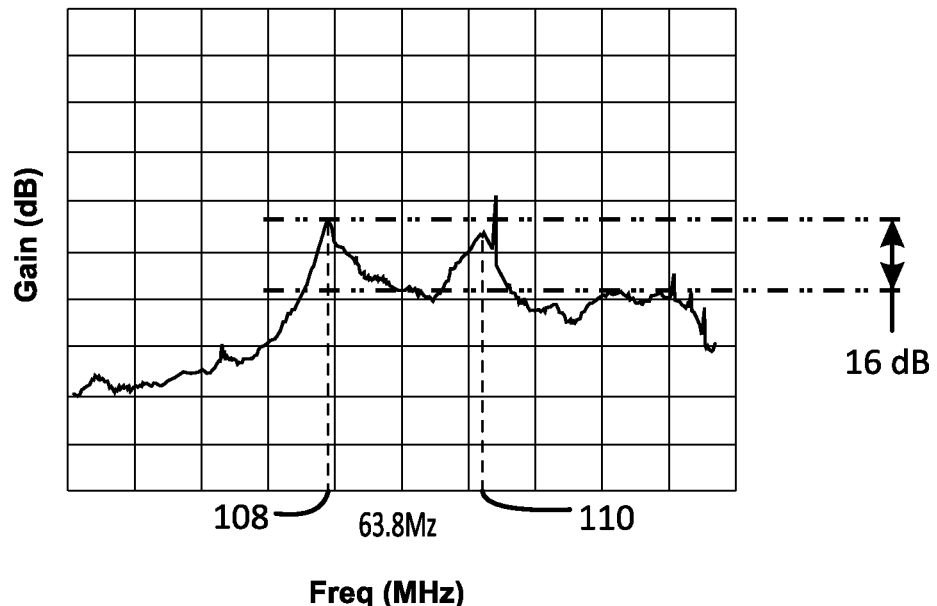
Figure 12:
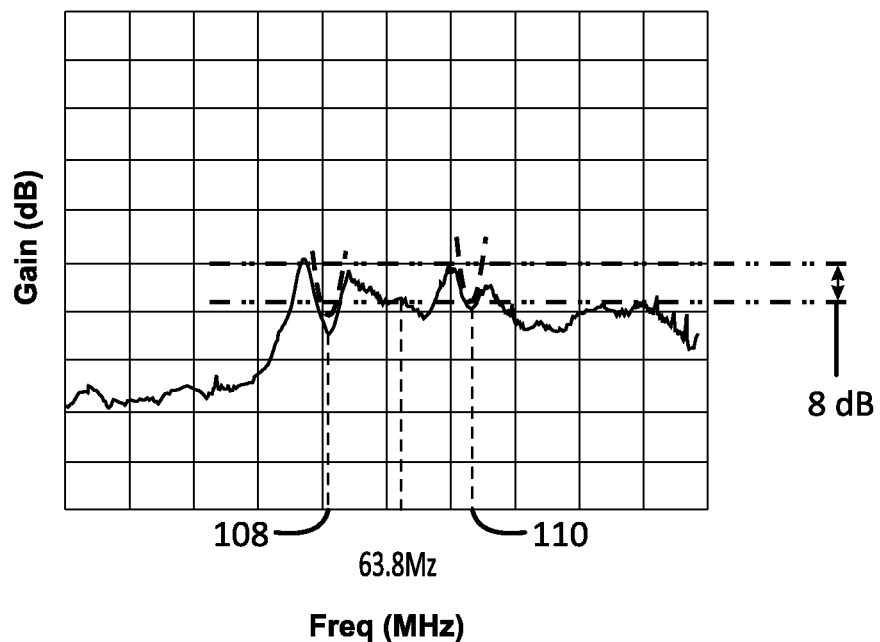

In a working example, FIGS. 10-12 measure and compare performance of the RF receive coil circuit 142 illustrated in FIG. 4 with and without the first and second resonant circuits 162 and 164. In this working example, the preamplifier 158 for the RF receive coil circuit 142 is amplifier model WMA1R5A from WanTcom Inc. The RF receive coil 146 is a strip line 156 having a length of approximately 59 cm and a width of approximately 5 mm. The impedance converter 160 is a 90° lattice-type Balun. The inductors 170 and 172 in the Balun are model 2222SQ-90N air coil inductor, SQ series inductors available from Coilcraft, Inc. and have a inductance of approximately 90 nH, and the capacitors 174 and 176 are model 800B680FTN500 available from American Technical Ceramics Corp. (ATC) having its principle place of business in Huntington Station, NY and have a capacitance of approximately 68 pF. The inductors 166 and 167 used in the first and second resonant circuits 162 and 164 are model 222XGLC available from Coilcraft, Inc., and have an inductance of approximately 2.2 µH and approximately 2.2 µH, respectively. The capacitors 168 and 169 are variable capacitor model JR030 available from Voltronics, Inc. and have a capacitance range of approximately 1.5 pF to approximately 3 pF. The first resonant circuit 162 is tuned to a resonant frequency of approximately 59 MHz, and the second resonant circuit 164 is tuned to a frequency of approximately 69 MHz.

FIG. 10 illustrates the measured response of the source impedance, $Z_s$, versus frequency in a Smith chart format, where the first trace 188 plots the source impedance, $Z_s$, for an RF receive coil circuit 142 not having the first and second resonant circuits 162 and 164, and the second trace 190 plots the source impedance, $Z_s$, for an RF receive coil circuit 142 having the first and second resonant circuits 162 and 164. The measured source impedance increases significantly around the first and second dog-ear frequencies 108 and 110 (approx. 59 MHz and 69 MHz) as shown on the second trace 190 at markers 1 and 2, respectively. The impedance plots illustrated in FIG. 10 were generated using a Model E8358A network analyzer, available from Agilent Inc. having its principle place of business in Palo Alto, Calif.

FIG. 11 plots the gain of the preamplifier 158 when the RF receive coil circuit 142 does not include the first and second resonant circuits 162 and 164. The gain at the dog-ear frequencies 108 and 110 is 59 MHz and 69 MHz, respectively, which are approximately 16 dB higher than the gain of the MR frequency of 63.8 MHz. By comparison, FIG. 12 plots the gain of the preamplifier 158 when the RF receive coil circuit 142 includes the first and second resonant circuits 162 and 164. When the first and second resonant circuits 162 and 164 are added to the RF receive coil circuit 142, the gain at the dog-ear frequencies 108 and 110 fall so that the gain at 59 and 69 MHz is only 8 dB higher than the MR frequency of 63.8 MHz. The plots illustrated in FIGS. 11 and 12 were generated using a Model 8594E spectrum analyzer available from HP Inc. having its principle place of business in Palo Alto, Calif.

The methods, apparatuses, and uses disclosed herein have many aspects including the following. Some examples of various aspects include the following apparatuses, systems, and methods. One aspect is an apparatus for receiving a magnetic resonance (MR) signal for imaging a patient, the MR signal including a MR frequency. The apparatus comprises a radio frequency (RF) coil having first and second end portions; a preamplifier in electrical communication with the RF coil, the preamplifier having a gain; and at least one resonant circuit electrically connected to at least one end portion of the RF coil.

Another aspect is an apparatus, alone or in any combination with the previous embodiments and aspects disclosed herein, wherein the RF coil and at least one resonant circuit form at least part of an RF receive coil circuit, and wherein the at least one resonant circuit increases the source impedance for the preamplifier at at least first and second frequencies.

Another aspect is an apparatus, alone or in any combination with the previous embodiments and aspects disclosed herein, wherein the RF coil and at least one resonant circuit form at least part of an RF receive coil circuit, and wherein the at least one resonant circuit decreases the gain of the preamplifier at the at least first and second frequencies.

Another aspect is an apparatus, alone or in any combination with the previous embodiments and aspects disclosed herein, wherein the at least one resonant circuit increases the source impedance by approximately 5 Ohms or more.

Another aspect is an apparatus, alone or in any combination with the previous embodiments and aspects disclosed herein, wherein the at least one resonant circuit increases the source impedance by approximately 5 Ohms or more at the first and second frequencies while the source impedance remains approximately constant at the MR frequency.

Another aspect is an apparatus, alone or in any combination with the previous embodiments and aspects disclosed herein, wherein the at least one resonant circuit decreases the gain of the preamplifier by approximately 3 dB or more.

Another aspect is an apparatus, alone or in any combination with the previous embodiments and aspects disclosed herein, wherein the at least one resonant circuit decreases the gain approximately 3 dB or more at the first and second frequencies while the gain of the preamplifier remains approximately constant at the MR frequency.

Another aspect is an apparatus, alone or in any combination with the previous embodiments and aspects disclosed herein, wherein the gain at the peak of the first and second dog ears and is not more than approximately 8 dB greater than the gain at the MR frequency.

Another aspect is an apparatus, alone or in any combination with the previous embodiments and aspects disclosed herein, wherein the gain at at least one of the first or second dog ear frequencies is approximately equal to or less than the MR frequency.

Another aspect is an apparatus, alone or in any combination with the previous embodiments and aspects disclosed herein, wherein the gain at at least one of the first or second dog ear frequencies is tuned to a determined gain.

Another aspect is an apparatus, alone or in any combination with the previous embodiments and aspects disclosed herein, wherein the gain at the peak of the first and second dog ears and when the RF receive coil circuit has the first and second resonant circuits and is approximately 8 dB less than the gain at the peak of the first and second dog ears and when the RF receive coil circuit does not have the first and second resonant circuits.

Another aspect is an apparatus, alone or in any combination with the previous embodiments and aspects disclosed herein, wherein the at least one resonant circuit comprises first and second resonant circuits.

Another aspect is an apparatus, alone or in any combination with the previous embodiments and aspects disclosed herein, wherein the RF coil and the first and second resonant circuits form at least part of an RF receive coil circuit, and wherein the first resonant circuit increases the source impedance of the RF receive coil circuit at a first frequency, and the second resonant circuit increases the source impedance of the RF receive coil circuit at a second frequency.

Another aspect is an apparatus, alone or in any combination with the previous embodiments and aspects disclosed herein, wherein the first resonant circuit increases the source impedance for the preamplifier at frequencies in at least a first bandwidth of frequencies, and the second resonant circuit increases the source impedance for the preamplifier in at least a second bandwidth of frequencies.

Another aspect is an apparatus, alone or in any combination with the previous embodiments and aspects disclosed herein, wherein the first bandwidth of frequencies is in the range of approximately 0.5 MHz to approximately 5 MHz, and the second bandwidth of frequencies is in the range of approximately 0.5 MHz to approximately 5 MHz.

Another aspect is an apparatus, alone or in any combination with the previous embodiments and aspects disclosed herein, wherein the first and second resonant circuits have substantially no effect on source impedance at the MR frequency.

Another aspect is an apparatus, alone or in any combination with the previous embodiments and aspects disclosed herein, wherein the first resonant circuit increases the source impedance for the preamplifier at the first frequency, and the second resonant circuit reduces the source impedance for the preamplifier at the second frequency.

Another aspect is an apparatus, alone or in any combination with the previous embodiments and aspects disclosed herein, wherein the first resonant circuit increases the gain for the preamplifier at the first frequency, and the second resonant circuit increases the gain for the preamplifier at the second frequency.

Another aspect is an apparatus, alone or in any combination with the previous embodiments and aspects disclosed herein, wherein the first resonant circuit increases the source impedance for the preamplifier at frequencies within a first range of frequencies, and the second resonant circuit increases the source impedance for the preamplifier at frequencies within a second range of frequencies.

Another aspect is an apparatus, alone or in any combination with the previous embodiments and aspects disclosed herein, wherein the first resonant circuit increases the gain for the preamplifier at frequencies within a first range of frequencies, and the second resonant circuit increases the gain for the preamplifier at frequencies within a second range of frequencies.

Another aspect is an apparatus, alone or in any combination with the previous embodiments and aspects disclosed herein, wherein the first and second resonant circuits have substantially no effect on the gain of the preamplifier at the MR frequency.

Another aspect is an apparatus, alone or in any combination with the previous embodiments and aspects disclosed herein, wherein the increase in source impedance for the preamplifier at the first and second bandwidths of frequencies is in a range of approximately 5 Ohms to approximately 100 Ohms.

Another aspect is an apparatus, alone or in any combination with the previous embodiments and aspects disclosed herein, wherein the decrease in gain for the preamplifier at the first bandwidth of frequencies is in a range of approximately 5 dB to approximately 12 dB, and the decrease in gain for the preamplifier at the second bandwidth of frequencies is in a range of approximately 5 dB to approximately 12 dB.

Another aspect is an apparatus, alone or in any combination with the previous embodiments and aspects disclosed herein, wherein each of the first and second resonant circuits comprise a capacitor and an inductor.

Another aspect is an apparatus, alone or in any combination with the previous embodiments and aspects disclosed herein, wherein the capacitor and inductor are arranged in series.

Another aspect is an apparatus, alone or in any combination with the previous embodiments and aspects disclosed herein, wherein at least one capacitor in the first and second resonant circuits is a variable capacitor.

Another aspect is an apparatus, alone or in any combination with the previous embodiments and aspects disclosed herein, wherein at least one inductor in the first and second resonant circuits is a variable inductor.

Another aspect is an apparatus, alone or in any combination with the previous embodiments and aspects disclosed herein, wherein each of the first and second resonant circuits are electrically connected between the first and second end portions of the RF coil.

Another aspect is an apparatus, alone or in any combination with the previous embodiments and aspects disclosed herein, wherein the first resonant circuit is electrically connected between the first end portion of the RF coil and ground, and the second resonant circuit is electrically connected between the second end portion of the RF coil and ground.

Another aspect is an apparatus, alone or in any combination with the previous embodiments and aspects disclosed herein, wherein the first end portion of the RF coil is in electrical communication with an input of the preamplifier and the second end portion of the RF coil is grounded.

Another aspect is an apparatus, alone or in any combination with the previous embodiments and aspects disclosed herein, wherein at least one of the first and second resonant circuits is electrically connected between the first and second end portions of the RF coil, and the other of the first and second resonant coils is electrically connected between the first end portion of the RF coil and ground.

Another aspect is an apparatus, alone or in any combination with the previous embodiments and aspects disclosed herein, further comprising a 90° impedance converter electrically connected between the first and second resonant circuits and the preamplifier.

Another aspect is an apparatus, alone or in any combination with the previous embodiments and aspects disclosed herein, further comprising a circuit board, wherein the RF coil, first and second resonant circuits, impedance converter, and preamplifier are mounted on the circuit board.

Another aspect is an apparatus, alone or in any combination with the previous embodiments and aspects disclosed herein, for processing a magnetic resonance (MR) signal for imaging a patient, the apparatus comprising a circuit board; a radio frequency (RF) coil having first and second end portions, the RF coil being formed at least in part by a trace on the circuit board; a Balun mounted on the circuit board, the Balun in electrical communication with the first and second end portions of the RF coil; a preamplifier mounted on the circuit board, the preamplifier in electrical communication with the Balun; and first and second resonant circuits mounted on the circuit board, the first resonant circuit in electrical communication with at least the first end portion of the RF coil between the first end portion of the RF coil and the Balun, the second resonant circuit being in electrical communication with at least the second end portion of the RF coil between the second end portion of the RF coil and the Balun, the first resonant circuit increasing source impedance for the preamplifier in a first bandwidth of frequencies, the second resonant circuit increasing source impedance for the preamplifier in a second bandwidth of frequencies, each of the first and second resonant circuits comprising a capacitor arranged in series with an inductor.

Another aspect is a method, alone or in any combination with the previous embodiments and aspects disclosed herein, for processing a radio frequency (RF) signal being transmitted along a circuit in a magnetic resonance imaging (MRI) machine, the circuit having an RF coil in electrical communication with a preamplifier, having a circuit, the RF signal including a magnetic resonance (MR) frequency, the circuit comprising at least a coil and a preamplifier, the method comprising: inducing an RF signal in the coil, the noise signal having first and second frequencies, the first frequency less than the MR frequency, and the second frequency greater than the MR frequency; increasing a source impedance for the preamplifier at the first and second frequencies; and amplifying the RF signal.

Another aspect is a method, alone or in any combination with the previous embodiments and aspects disclosed herein, wherein the circuit has at least a first and second resonant circuit in electrical communication with the RF coil, and the act of increasing a source impedance for the preamplifier at the first and second frequencies comprises tuning the circuit with the first and second resonant circuits.

Another aspect is a method, alone or in any combination with the previous embodiments and aspects disclosed herein, wherein the circuit has at least a first and second resonant circuit in electrical communication with the RF coil, and the act of increasing a source impedance for the preamplifier at the first and second frequencies comprises increasing the source impedance for the preamplifier at the first and second frequencies in an amount approximately 5 Ohms or more.

Another aspect is a method, alone or in any combination with the previous embodiments and aspects disclosed herein, wherein the circuit has at least a first and second resonant circuit in electrical communication with the RF coil, and the act of increasing a source impedance for the preamplifier at the first and second frequencies comprises maintaining the source impedance at the MR frequency approximately constant.

Another aspect is a method, alone or in any combination with the previous embodiments and aspects disclosed herein, wherein the circuit has at least a first and second resonant circuit in electrical communication with the RF coil, and the act of increasing a source impedance for the preamplifier at the first and second frequencies comprises increasing the source impedance for the preamplifier at the first and second frequencies in an amount approximately 5 Ohms or more while maintaining the source impedance at the MR frequency approximately constant.

Another aspect is a method, alone or in any combination with the previous embodiments and aspects disclosed herein, wherein the first resonant circuit has a first resonant frequency at least approximately the same as the first frequency, and the second resonant circuit has a second resonant frequency at least approximately the same as the second frequency.

Another aspect is a method, alone or in any combination with the previous embodiments and aspects disclosed herein, wherein the preamplifier has an operating frequency corresponding to the MR frequency, and wherein the operating frequency corresponding to the MR frequency is between the first and second frequencies.

Another aspect is a method, alone or in any combination with the previous embodiments and aspects disclosed herein, wherein tuning the circuit lowers the gain of the preamplifier at the first and second frequencies relative to the gain of the preamplifier at the first and second frequencies for an untuned circuit.

Another aspect is a method, alone or in any combination with the previous embodiments and aspects disclosed herein, wherein tuning the circuit lowers the gain of the preamplifier at at least one of the first and second frequencies to a level no more than approximately 8 dB greater than the gain at the MR frequency.

Another aspect is a method, alone or in any combination with the previous embodiments and aspects disclosed herein, wherein tuning the circuit lowers the gain of the preamplifier at at least one of the first and second frequencies to a level approximately equal to or less than the gain at the MR frequency.

Another aspect is a method, alone or in any combination with the previous embodiments and aspects disclosed herein, wherein tuning the circuit lowers the gain of the preamplifier at at least one of the first and second frequencies to a determined gain.

Another aspect is a method, alone or in any combination with the previous embodiments and aspects disclosed herein, wherein tuning the circuit lowers the gain of the preamplifier at at least one of the first and second frequencies approximately 8 MHz or more.

Another aspect is a method, alone or in any combination with the previous embodiments and aspects disclosed herein, wherein the preamplifier in the tuned circuit has approximately the same gain as the preamplifier in an untuned circuit.

Another aspect is a method, alone or in any combination with the previous embodiments and aspects disclosed herein, further comprising decreasing the gain of the preamplifier at the first and second frequencies approximately 3 dB or more.

Another aspect is a method, alone or in any combination with the previous embodiments and aspects disclosed herein, further comprising decreasing the gain of the preamplifier at the first and second frequencies approximately 3 dB or more while maintaining the gain of the preamplifier at the MR frequency approximately constant.

Another aspect is a method, alone or in any combination with the previous embodiments and aspects disclosed herein, wherein the at least first and second resonant circuits have no effect on the source impedance at the MR frequency.

Another aspect is a method, alone or in any combination with the previous embodiments and aspects disclosed herein, further comprising: converting the RF signal from a balanced RF signal to an unbalanced RF signal before the act of amplifying the RF signal.

Another aspect is a method, alone or in any combination with the previous embodiments and aspects disclosed herein, wherein the act of converting the RF signal from a balanced RF signal to an unbalanced RF signal comprises passing the RF signal through a Balun.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims. It is intended that any such modifications and equivalents be included in the scope of the claims.

The invention claimed is:

1. An apparatus for receiving a magnetic resonance (MR) signal for imaging a patient, the MR signal including a MR frequency, the apparatus comprising:
   a radio frequency (RF) coil having first and second end portions, the RF coil configured to output a magnetic resonance imaging (MRI) signal, the MRI signal comprising a MR frequency;
   an impedance converter in electrical communication with the RF coil;
   a preamplifier in electrical communication with the impedance converter, the preamplifier having a gain; and
   at least first and second resonant circuits electrically connected to at least one end portion of the RF coil, the first resonant circuit tuned to resonate at a first frequency, the second resonant circuit tuned to resonate at a second frequency, the first frequency being lower than the MR frequency and corresponding to a first dog-ear frequency, the second frequency being greater than the MR frequency and corresponding to a second dog-ear frequency, thereby reducing gain of the preamplifier at the first and second frequencies.

2. The apparatus of claim 1, wherein the RF coil and at least one resonant circuit form at least part of an RF receive coil circuit, and wherein the at least one resonant circuit increases a source impedance for the preamplifier for at least first and second frequencies.

3. The apparatus of claim 2, wherein the RF coil and at least one resonant circuit form at least part of an RF receive coil circuit, and wherein the at least one resonant circuit decreases the gain of the preamplifier at the at least first and second frequencies.

4. The apparatus of claim 1, wherein the at least one resonant circuit comprises first and second resonant circuits.

5. The apparatus of claim 4, wherein the RF coil and the first and second resonant circuits form at least part of an RF receive coil circuit, and wherein the first resonant circuit increases the source impedance of the RF receive coil circuit at a first frequency, and the second resonant circuit increases the source impedance of the RF receive coil circuit at a second frequency.

6. The apparatus of claim 5, wherein the first resonant circuit increases the source impedance for the preamplifier at frequencies in at least a first bandwidth of frequencies, and the second resonant circuit increases the source impedance for the preamplifier in at least a second bandwidth of frequencies.

7. The apparatus of claim 6, wherein the first bandwidth of frequencies is in the range of approximately 0.5 MHz to approximately 5 MHz, and the second bandwidth of frequencies is in the range of approximately 0.5 MHz to approximately 5 MHz.

8. The apparatus of claim 7, wherein the first and second resonant circuits have substantially no effect on source impedance at the MR frequency.

9. The apparatus of claim 5, wherein the first resonant circuit increases the source impedance for the preamplifier at the first frequency, and the second resonant circuit increases the source impedance for the preamplifier at the second frequency.

10. The apparatus of claim 5, wherein the first resonant circuit increases the source impedance for the preamplifier at frequencies within a first range of frequencies, and the second resonant circuit increases the source impedance for the preamplifier at frequencies within a second range of frequencies.

11. The apparatus of claim 10, wherein the first and second resonant circuits have substantially no effect on gain of the preamplifier at the MR frequency.

12. The apparatus of claim 10, wherein the increase in source impedance for the preamplifier at the first and second bandwidths of frequencies is in a range of approximately 5 Ohms to approximately 100 Ohms.

13. The apparatus of claim 10, further comprising:
   a circuit board;
   wherein the RF coil, the first and second resonant circuits, the impedance converter, and the preamplifier are mounted on the circuit board.

14. The apparatus of claim 4, wherein each of the first and second resonant circuits comprise a capacitor and an inductor.

15. The apparatus of claim 14, wherein the capacitor and the inductor are arranged in series.

16. The apparatus of claim 14, wherein at least one capacitor in the first and second resonant circuits is a variable capacitor.

17. The apparatus of claim 14, wherein at least one inductor in the first and second resonant circuits is a variable inductor.

18. The apparatus of claim 4, wherein each of the first and second resonant circuits are electrically connected between the first and second end portions of the RF coil.

19. The apparatus of claim 4, wherein the first resonant circuit is electrically connected between the first end portion of the RF coil and ground, and the second resonant circuit is electrically connected between the second end portion of the RF coil and ground.

20. The apparatus of claim 19, wherein the first end portion of the RF coil is in electrical communication with an input of the impedance converter and the second end portion of the RF coil is grounded.

21. The apparatus of claim 4, wherein at least one of the first and second resonant circuits is electrically connected between the first and second end portions of the RF coil, and the other of the first and second resonant coils is electrically connected between the first end portion of the RF coil and ground.

22. The apparatus of claim 4, wherein the impedance converter is a Balun.

23. An apparatus for processing a magnetic resonance (MR) signal for imaging a patient, the apparatus comprising:
   a circuit board;
   a radio frequency (RF) coil having first and second end portions, the RF coil being formed at least in part by a trace on the circuit board, the RF coil configured to output a magnetic resonance imaging (MRI) signal, the MRI signal comprising a MR frequency;
   a Balun mounted on the circuit board, the Balun in electrical communication with the first and second end portions of the RF coil;
   a preamplifier mounted on the circuit board, the preamplifier in electrical communication with the Balun; and first and second resonant circuits mounted on the circuit board, the first resonant circuit in electrical communication with at least the first end portion of the RF coil between the first end portion of the RF coil and the Balun, the second resonant circuit being in electrical communication with at least the second end portion of the RF coil between the second end portion of the RF coil and the Balun, the first resonant circuit increasing source impedance for the preamplifier in a first bandwidth of frequencies lower than the MR frequency and corresponding to a first dog-ear frequency thereby reducing gain of the preamplifier in the first bandwidth of frequencies, the second resonant circuit increasing source impedance for the preamplifier in a second bandwidth of frequencies higher than the MR frequency and corresponding to a first dog-ear frequency thereby reducing gain of the preamplifier in the second bandwidth of frequencies, each of the first and second resonant circuits comprising a capacitor arranged in series with an inductor, the first bandwidth of frequencies corresponding to a first dog-ear frequency, the second bandwidth of frequencies corresponding to a second dog-ear frequency.

24. A method of processing a radio frequency (RF) signal being transmitted along a circuit in a magnetic resonance imaging (MRI) machine, the circuit having an RF coil in electrical communication with a preamplifier, the RF signal including a magnetic resonance (MR) frequency, the circuit comprising at least a coil and a preamplifier, the method comprising:
inducing an RF signal in the coil, the RF signal having first and second frequencies, the first frequency less than the MR frequency, and the second frequency greater than the MR frequency, the first frequency corresponding to a first dog-ear frequency, the second frequency corresponding to a second dog-ear frequency;
increasing a source impedance for the preamplifier at the first and second frequencies;
reducing gain of the preamplifier at the first and second frequencies; and
amplifying the RF signal.

25. The method of claim 24, wherein the circuit has at least first and second resonant circuits in electrical communication with the RF coil, and the act of increasing a source impedance for the preamplifier at the first frequency and the second frequency comprises:
tuning the circuit with the first and second resonant circuits.

26. The method of claim 25, wherein the first resonant circuit has a first resonant frequency at least approximately the same as the first frequency, and the second resonant circuit has a second resonant frequency at least approximately the same as the second frequency.

27. The method of claim 25, wherein the preamplifier has an operating frequency corresponding to the MR frequency, and wherein the operating frequency is between the first and second frequencies.

28. The method of claim 25, wherein tuning the circuit lowers the gain of the preamplifier at the first and second frequencies relative to the gain at first and second amplifiers for an untuned circuit.

29. The method of claim 28, wherein the preamplifier in the tuned circuit has approximately the same gain as the preamplifier in an untuned circuit.

30. The method of claim 28, wherein the at least first and second resonant circuits have no effect on the source impedance at the MR frequency.

31. The method of claim 25, further comprising:
converting the RF signal from a balanced RF signal to an unbalanced RF signal before the act of amplifying the RF signal.

32. The method of claim 31, wherein the act of converting the RF signal from a balanced RF signal to an unbalanced RF signal comprises passing the RF signal through a Balun.

* * * * *